United States Patent
Xiong et al.

(10) Patent No.: US 9,445,375 B2
(45) Date of Patent: Sep. 13, 2016

(54) METHOD AND SYSTEM FOR UPDATING PREDISTORTION COEFFICIENT

(71) Applicant: DATANG MOBILE COMMUNICATIONS EQUIPMENT CO., LTD, Beijing (CN)

(72) Inventors: Jun Xiong, Beijing (CN); Tao Duan, Beijing (CN); Huarong Sun, Beijing (CN); Peng Xiao, Beijing (CN); Ce Wang, Beijing (CN); Jieli Wang, Beijing (CN)

(73) Assignee: DATANG MOBILE COMMUNICATIONS EQUIPMENT CO., LTD., Beijing (CN)

( * ) Notice: Subject to any disclaimer, the term of this patent is extended or adjusted under 35 U.S.C. 154(b) by 0 days.

(21) Appl. No.: 14/760,710

(22) PCT Filed: Dec. 30, 2013

(86) PCT No.: PCT/CN2013/090886
§ 371 (c)(1),
(2) Date: Jul. 14, 2015

(87) PCT Pub. No.: WO2014/114170
PCT Pub. Date: Jul. 31, 2014

(65) Prior Publication Data
US 2015/0358922 A1  Dec. 10, 2015

(30) Foreign Application Priority Data

Jan. 25, 2013  (CN) .......................... 2013 1 0030478

(51) Int. Cl.
*H03F 1/32* (2006.01)
*H04B 1/04* (2006.01)
(Continued)

(52) U.S. Cl.
CPC .......... *H04W 52/243* (2013.01); *H03F 1/3241* (2013.01); *H03F 1/3247* (2013.01);
(Continued)

(58) Field of Classification Search
CPC ............... H04B 1/0475; H04B 2001/0425; H04L 27/368; H03F 1/3241; H03F 1/3247; H03F 220/3227; H03F 2201/32331; H03F 2201/3227; H03F 2201/3233; H03F 1/3258
USPC ....................... 375/296, 297; 455/114.3, 126
See application file for complete search history.

(56) References Cited

U.S. PATENT DOCUMENTS

| 5,740,520 | A | * | 4/1998 | Cyze | ..................... | H03F 1/3241 |
| | | | | | | 455/114.3 |
| 6,909,756 | B1 | * | 6/2005 | Nakajima | ............. | H03F 1/3247 |
| | | | | | | 327/317 |
| 8,571,495 | B2 | * | 10/2013 | Nagatani | ............... | H03F 1/3258 |
| | | | | | | 330/136 |

FOREIGN PATENT DOCUMENTS

| CN | 1335699 A | 2/2002 |
| CN | 1795607 A | 6/2006 |

(Continued)

*Primary Examiner* — Betsy Deppe
(74) *Attorney, Agent, or Firm* — Gokalp Bayramoglu

(57) ABSTRACT

The invention is a method and a system for updating pre-distortion coefficients, which is used to solve the problem of interference with neighbor cells due to the inferior pre-distortion coefficients. The method includes: presetting a primary table and a standby table, which store default and updated pre-distortion coefficients respectively; when a data source of a pre-distortion processor adopts the standby table, adopting the updated pre-distortion coefficients to perform parameter output processing to acquire pre-distortion parameters, and conveying the pre-distortion parameters and an input signal to the pre-distortion processor to process to acquire pre-distortion signals; conveying the pre-distortion signals through various signal processors to acquire a first signal, and determining the power data of the first signal; and based on the comparing result of the power data of the first signal and a setting range, there are different actions.

20 Claims, 8 Drawing Sheets

(51) Int. Cl.

| | |
|---|---|
| *H04W 52/24* | (2009.01) |
| *H04W 52/16* | (2009.01) |
| *H04W 52/52* | (2009.01) |
| *H04L 25/03* | (2006.01) |
| *H04L 25/49* | (2006.01) |
| *H03F 3/24* | (2006.01) |
| *H03F 3/19* | (2006.01) |

(52) U.S. Cl.
CPC .............. *H03F 1/3258* (2013.01); *H03F 3/19* (2013.01); *H03F 3/245* (2013.01); *H04B 1/0475* (2013.01); *H04L 25/03343* (2013.01); *H04L 25/49* (2013.01); *H04W 52/16* (2013.01); *H04W 52/52* (2013.01); *H03F 2201/3233* (2013.01)

(56) References Cited

FOREIGN PATENT DOCUMENTS

| | | |
|---|---|---|
| CN | 101056288 A | 10/2007 |
| CN | 101057394 A | 10/2007 |
| CN | 101355536 A | 1/2009 |
| CN | 101771383 A | 7/2010 |
| CN | 103107967 A | 5/2013 |

* cited by examiner

METHOD AND SYSTEM FOR UPDATING PREDISTORTION COEFFICIENT

TECHNICAL FIELD

The present application relates to the field of communication technology, and particularly to a method and a system for updating pre-distortion coefficients.

BACKGROUND ART

The Digital Pre-Distortion (DPD) refers to performing pre-distortion processing on signals based on memory multinomial. After pre-distortion processing, a pre-distortion coefficient and an input signal are usually used together to determine a pre-distortion signal. For the training of the pre-distortion coefficient, a method in which a training sequence is stored in a base station and periodically sent is usually employed.

However, since the training sequence is not service data, periodically sending the training sequence may seriously interfere with users in the cell. For this reason, it is necessary to collect signals in real-time to train pre-distortion coefficients. However, the data collected in real-time cannot ensure an availability of the coefficient in this training. For example, the coefficient in this training is far away from that in last training.

If an inferior pre-distortion coefficient is adopted to perform the pre-distortion processing, the Adjacent Channel Power Ratio (ACPR) of the outputted signals after performing the pre-distortion processing may be deteriorated so as to seriously interfere with neighbor cells.

SUMMARY OF THE INVENTION

The present application provides a method and a system for updating pre-distortion coefficients, in order to solve the problem of interference with neighbor cells due to the inferior pre-distortion coefficients.

To solve above problem, the present application discloses a method for updating pre-distortion coefficients, including:

presetting a primary table and a standby table, wherein the primary table stores default pre-distortion coefficients and the standby table stores updated pre-distortion coefficients;

when a data source of a pre-distortion processor adopts the standby table, adopting the updated pre-distortion coefficients to perform parameter output processing to acquire pre-distortion parameters, and conveying the pre-distortion parameters and an input signal to the pre-distortion processor to process to acquire pre-distortion signals;

conveying the pre-distortion signals through various signal processors to process to acquire a first signal, and determining the power data of the first signal;

if the power data of the first signal is more than or equal to setting range, continuing to adopt the standby table as the data source of the pre-distortion processor; and if the power data of the first signal is less than the setting range, switching the data source of the pre-distortion processor to the primary table.

Optionally, the step of determining the power data of the first signal comprises: determining power parameters according to the continuity of the first signal; and performing the Fast Fourier Transformation on the first signal, and determining the power data of the first signal together with the power parameters, wherein the power data includes at least one of an adjacent channel power and an adjacent channel power ratio.

Optionally, the step of determining the power parameters according to the continuity of the first signal comprises: detecting the continuity of the first signal, and searching a corresponding parameter configuration table for the power parameters according to the continuity, wherein the power parameters include at least one of sampling rate, central frequency point, number of sampling points, number of carriers, carrier in-band width and carrier transmission band width.

Optionally, the step of performing the Fast Fourier Transformation on the first signal, and determining the power data of the first signal together with the power parameters comprises: calculating various frequency points of frequency band of the first signal according to the power parameters; performing the Fast Fourier Transformation to acquire a power spectral density of each frequency point after denoising and correcting the first signal; performing weighting process on the power spectral density, and determining an effective power and an adjacent channel power of the first signal; and calculating a ratio of the effective signal power to the adjacent channel signal power and taking the logarithm, to acquire an adjacent channel power ratio of the first signal.

Optionally, if the standby table is empty at the time of presetting, the method further comprises: by using the primary table as the data source of the pre-distortion processor, adopting the default pre-distortion coefficients to perform parameter output processing to acquire pre-distortion parameters, and conveying the pre-distortion parameters and an input signal to the pre-distortion processor to process to acquire pre-distortion signals; and conveying the pre-distortion signals through various signal processors to process to acquire a first signal.

Optionally, after the step of conveying the pre-distortion signals through various signal processors to process to acquire a first signal, the method further comprises: performing pre-distortion parameter training on the first signal to acquire an updated pre-distortion coefficient, and updating the updated pre-distortion coefficient to the standby table.

Optionally, the method further comprises: if the primary table is used as the data source of the pre-distortion processor, then after updating the updated pre-distortion coefficient to the standby table, switching the data source of the pre-distortion processor to the standby table.

Optionally, the step of updating the updated pre-distortion coefficient to the standby table comprises: calculating a coefficient weighted sum of the updated pre-distortion coefficient, and when the coefficient weighted sum satisfies a predefined condition, updating the updated pre-distortion coefficient to the standby table.

Accordingly, the embodiment of the present application also discloses a system for updating pre-distortion coefficients, including: a parameter controller, a pre-distortion processor, various signal processors, an arithmetic unit and a switch controller;

wherein, the parameter controller comprises: a primary table and a standby table, wherein the primary table stores default pre-distortion coefficients and the standby table stores updated pre-distortion coefficients;

the parameter controller is configured to adopt the updated pre-distortion coefficients to perform parameter output processing to acquire pre-distortion parameters, when a data source of the pre-distortion processor adopts the standby table;

the pre-distortion processor is configured to convey the pre-distortion parameters and an input signal to the pre-distortion processor to acquire pre-distortion signals;

the various signal processors are configured to process the pre-distortion signals to acquire a first signal;

the arithmetic unit is configured to determine the power data of the first signal; and the switch controller is configured to, if the power data of the first signal is more than or equal to setting range, continue to adopt the standby table as the data source of the pre-distortion processor; if the power data of the first signal is less than the setting range, switch the data source of the pre-distortion processor to the primary table.

Optionally, the arithmetic unit is particularly configured to determine power parameters according to the continuity of the first signal; perform the Fast Fourier Transformation on the first signal, and determine the power data of the first signal together with the power parameters, wherein the power data includes at least one of an adjacent channel power and an adjacent channel power ratio.

Optionally, the arithmetic unit is particularly configured to detect the continuity of the first signal, and search a corresponding parameter configuration table for the power parameters according to the continuity, wherein the power parameters include at least one of sampling rate, central frequency point, number of sampling points, number of carriers, carrier in-band width and carrier transmission band width.

Optionally, the arithmetic unit is particularly configured to calculate various frequency points of frequency band of the first signal according to the power parameter; perform the Fast Fourier Transformation to acquire a power spectral density of each frequency point after denoising and correcting the first signal; perform weighting process on the power spectral density, and determine an effective power and an adjacent channel power of the first signal; calculate a ratio of the effective signal power to the adjacent channel signal power and take the logarithm, to acquire an adjacent channel power ratio of the first signal.

Optionally, if the standby table is empty at the time of presetting; the parameter controller is further configured to, by using the primary table as the data source of the pre-distortion processor, adopt the default pre-distortion coefficients to perform parameter output processing to acquire pre-distortion parameters; the pre-distortion processor is configured to convey the pre-distortion parameters and an input signal to the pre-distortion processor to process to acquire pre-distortion signals; and the various signal processors are configured to convey the pre-distortion signals through various signal processors to process to acquire a first signal.

Optionally, the system further includes: a parameter trainer which is configured to perform pre-distonion parameter training on the first signal to acquire an updated pre-distortion coefficient, and update the updated pre-distortion coefficient to the standby table.

Optionally, the switch controller is further configured to, if the primary table is used as the data source of the pre-distortion processor, then after updating the updated pre-distortion coefficient to the standby table, switch the data source of the pre-distortion processor to the standby table.

Optionally, the parameter trainer is particularly configured to calculate a coefficient weighted sum of the updated pre-distortion coefficient, and when the coefficient weighted sum satisfies a predefined condition, update the updated pre-distortion coefficient to the standby table.

Compared with the prior art, the preset application has advantages as follows:

Firstly, a primary table and a standby table may be preset in the embodiment of the present application, wherein the primary table stores default pre-distortion coefficients, and the standby table stores updated pre-distortion coefficients. In such a manner, when the standby table is used as a data source, the updated pre-distortion coefficient may be performed pre-distortion processing to acquire feedback power data of the first signal. The power data of the first signal may be detected in the embodiment of the present application, if the power data is within a setting range, then the standby table is continued to adopt as the data source of the pre-distortion processor; if the power data is not within the setting range, then the data source of the pre-distortion processor is switched to the primary table. In such a manner, it may be possible to detect the status of the power data, in turn judge whether it interferes with neighbor cells and the status of in-band signals is deteriorated, subsequently judge the status of the real-time updated pre-distortion coefficients, and then select the primary table or the standby table according to a specific condition, in order to reduce the interference with neighbor cells to the lowest extent.

Secondly, the first signal after processing the updated pre-distortion coefficient may be acquired in the embodiment of the present application, then the ACP and the ACPR of the first signal may be determined by the power parameter, in turn the status of interference of the updated pre-distortion coefficient with the neighbor cells and the condition of influence on signals within adjacent frequency band may be judged by the ACP and the ACPR, and then whether the data source during the pre-distortion processing is the primary table or the standby table may be determined. In such a manner, it is possible to adopt the superior pre-distortion coefficient to perform the pre-distortion processing, in order to reduce the interference with neighbor cells to the lowest extent.

DETAILED DESCRIPTION OF THE EMBODIMENTS

Figure 1:
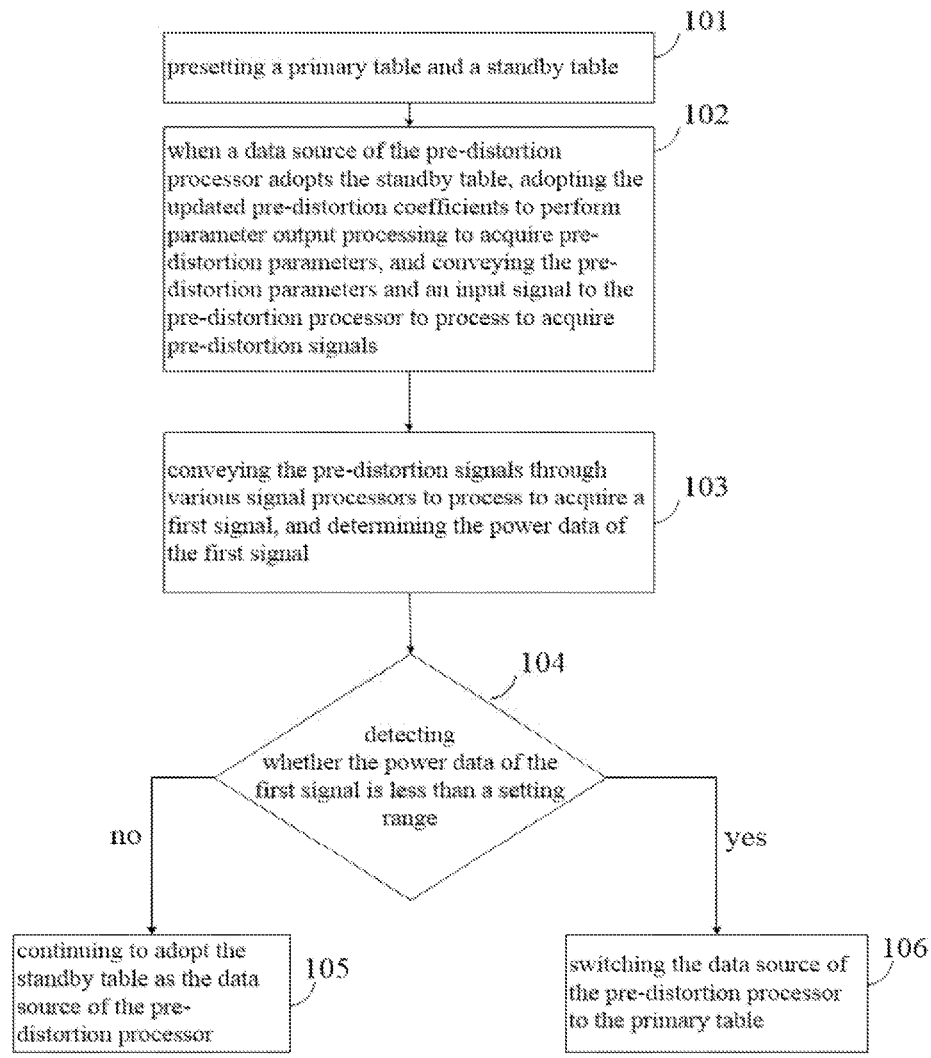
FIG. 1 is a flow chart showing a method for updating pre-distortion coefficients according to a first embodiment of the present application.

In order to readily understand above objects, features and advantages of the present application, the present application will be described in detail in conjunction with accompanying drawings and specific embodiments hereinafter.

Digital Pre-Distortion (DPD) is a pre-distortion processing of signals based on memory multinomial, a mathematical model of which may include:

$$z(n) = \sum_{m=0}^{M} x(n-m) \sum_{q=1}^{Q} w_{m,q} |x(n-m)|^{(q-1)} \quad (1)$$
$$= \sum_{m=0}^{M} x(n-m) \cdot LUT_m(|x(n-m)|)$$
$$= \sum_{m=0}^{M} x(n-m) \cdot LUT_m(Q(r_{n,m}))$$

wherein:

$r_{n,m}$ is amplitude of an input signal: $r_{n,m}=|x(n-m)|$, Q(•) is a quantization factor.

LUT (Look-Up-Table) is a pre-distortion parameter (DPD parameter), and an input address of the LUT is dependent on an amplitude $Q(r_{n,m})$ of quantized input signal. In particular:

$$LUT_m(|x(n-m)|) = \sum_{q=1}^{Q} w_{m,q}|x(n-m)|^{(q-1)}, m = 1 \ldots M, n = 1 \ldots N \quad (2)$$

$LUT_m(|x(n-m)|)$ is a pre-distortion parameter corresponding to an index according to the input signal amplitude $|x(n-m)|$. In the update of pre-distortion, the pre-distortion parameter is stored according to $|x(n-m)|$, in the pre-distortion processing, the pre-distortion parameter is extracted according to $|x(n-m)|$.

$w_{m,q}$, m=1 ... M, q=1 ... Q is a pre-distortion coefficient (DPD coefficient), and after W is calculated, a pre-distortion signal y(n) can be calculated by a pre-distortion module.

Therefore, for the training of DPD coefficients, a method in which a training sequence is stored in a base station and periodically sent is usually employed.

However, since the training sequence is not service data, periodically sending the training sequence may seriously interfere with users in a cell. For this reason, it is necessary to collect signals in real time to perform the training of the DPD coefficients. However, the real time collection of data cannot ensure an availability of the coefficients in this training. For example, the coefficients in this training are far away from that in last training.

If an inferior DPD coefficient is adopted to perform the DPD processing, the Adjacent Channel Power Ratio (ACPR) of the outputted signals after processing may be deteriorated so as to seriously interfere with neighbor cells and influence on signals within adjacent frequency band, and the quality of the in-band signals may be deteriorated too. This condition will not be improved until a superior DPD coefficient is adopted to perform the DPD processing.

Nevertheless it is not possible to determine when the superior DPD coefficient occurs. If the superior DPD coefficient does not occur, the above problems could not be solved.

The embodiments of the present application provides a method for updating pre-distortion coefficients to acquire a signal with DPD processing performed on the pre-distortion coefficients, and the power data of the signal may be detected to select the pre-distortion coefficients according to the power data.

First Embodiment

With reference to FIG. 1, it shows a flow chart of a method for updating pre-distortion coefficients according to a first embodiment of the present application.

Step 101, the user presets a primary table and a standby table.

Wherein, the primary table stores default pre-distortion coefficients. The default pre-distortion coefficients are relatively superior. That is, the power data of pre-distortion signals acquired by adopting the default pre-distortion coefficients to perform pre-distortion processing is superior, with less interference with the neighbor cells. Further, the default pre-distortion coefficients in the primary table are kept constant, such that the primary table could be used as a data source of a pre-distortion processor at any time. In particular, the arithmetic sum of the default pre-distortion coefficients is configured to nearly 1, such that the service signal may not interfere with a power amplifier when passing through a pre-distortion channel.

The standby table is used to store updated pre-distortion coefficients. That is, a first signal processed by the pre-distortion processor and other signal processing devices may be performed the pre-distortion coefficient training to determine the pre-distortion coefficients, and updated to the standby table. Therefore, the pre-distortion coefficients stored in the standby table are updated in real time. Each time the pre-distortion processing is performed, the pre-distortion coefficients may be updated.

Step 102, when a data source of the pre-distortion processor adopts the standby table, a parameter controller adopts the updated pre-distortion coefficients to perform parameter output processing to acquire pre-distortion parameters, and conveys the pre-distortion parameters and an input signal to the pre-distortion processor to be processed to acquire pre-distortion signals.

The standby table is used as the data source of the pre-distortion processor, and then the input signal and the updated pre-distortion coefficients are performed parameter output processing. That is, the data signal and the updated pre-distortion coefficients are adopted to acquire the pre-distortion parameters. Then, the pre-distortion parameters and the input signal are processed through the pre-distortion processor to acquire the corresponding pre-distortion signals.

Step 103, a plurality of signal processors process the pre-distortion signals to acquire a first signal, and determine the power data of the first signal.

The pre-distortion signals can be processed by various signal processors, such as a Digital to Analog Converter (DAC), a power amplifier, an Analog to Digital Converter (ADC) and etc., to process to acquire the first signal. Then the power data of the first signal may be calculated.

In this embodiment, the power data may comprise: Adjacent Channel Power (ACP) and ACPR and etc.

Wherein, ACPR is an indicator which is set to measure the interference of a main channel signal of a radio frequency output signal with an adjacent frequency point signal, and is a key indicator for measuring a non-linear distortion degree of an output signal of the power amplifier. ACPR may be acquired by measuring the output signal of the power amplifier by a feedback channel.

Step 104, an arithmetic unit detects whether the power data of the first signal is less than a setting range.

In the embodiment of the present application, the updated pre-distortion coefficients can be acquired by performing pre-distortion coefficient training on the first signal. If an inferior pre-distortion coefficient is adopted for the pre-distortion processing, the resultant ACPR of the pre-distortion signal will be inferior too, thereby seriously interfering with neighbor cells and signals within adjacent frequency bands.

Herein, the superiority or inferiority of the updated pre-distortion coefficients is in relation to the first signal. That is, the superiority and inferiority of the power data of the first signal may influence the updated pre-distortion coefficients. Therefore, in order to avoid above problem, the embodiment of the present application is provided with a setting range of the power data in advance for assessing the superiority and inferiority of the power data. Herein, if the power data is more than or equal to the setting range, it may be indicated that the power data of the signal is superior; if the power data is less than the setting range, it may be indicated that the power data of the signal is inferior.

For example, assuming that the power data is ACPR, the setting range may be set to 43 dBc~48 dBc. If the ACPR of the first signal is less than 43 dBc, it may be indicated that the ACPR is inferior; if the ACPR of the first signal is more than 48 dBc, it may be indicated that the ACPR is superior.

In particular, the method may detect whether the power data of the first signal is less than the setting range; if not, that is the power data of the first signal is more than or equal to the setting range, then proceed to Step 105; if yes, that is, the power data of the first signal is less than the setting range, then proceed to Step 106.

Step 105, the pre-distortion processor continues to adopt the standby table as the data source.

If the power data of the first signal is within the setting range, then it may be indicated that the power data of the first signal is superior, that is, the first signal is superior, and an updated pre-distortion coefficient acquired by adopting the first signal to perform the pre-distortion coefficient training may be stored in the standby table. At this point, the updated pre-distortion coefficient is also superior, so that the standby table is continuously adopted as the data source of the pre-distortion processor.

Step 106, a switch controller switches the data source of the pre-distortion processor to the primary table.

If the power data of the first signal is not within the setting range, then it may be indicated that the power data of the first signal is inferior, that is, the first signal is inferior, after an updated pre-distortion coefficient acquired by adopting the first signal to perform pre-distortion coefficient training is stored in the standby table, if the standby table is continuously adopted as the data source of the pre-distortion processor, then the pre-distortion coefficient may be inferior during the subsequent pre-distortion processing so as to interfere with neighbor cells and deteriorate the quality of in-band signals.

Therefore, in this case, the data source of the pre-distortion processor is necessarily switched to the primary table. Subsequently the default pre-distortion coefficients in the primary table will be adopted.

In conclusion, a primary table and a standby table may be preset in the embodiment of the present application, wherein the primary table stores default pre-distortion coefficients, and the standby table stores updated pre-distortion coefficients. In such a manner, when the standby table is used as a data source, the updated pre-distortion coefficient may be performed pre-distortion processing to acquire feedback power data of the first signal. The power data of the first signal may be detected in the embodiment of the present application, if the power data is within a setting range, then the standby table is continued to adopt as the data source of the pre-distortion processor; if the power data is not within the setting range, then the data source of the pre-distortion processor is switched to the primary table. In such a manner, it may be possible to detect the status of the power data, in turn judge whether it interferes with neighbor cells and the status of in-band signals is deteriorated, subsequently judge the status of the real-time updated pre-distortion coefficients, and then select the primary table or the standby table according to a specific condition, in order to reduce the interference with neighbor cells to the lowest extent.

Second Embodiment

Figure 2:
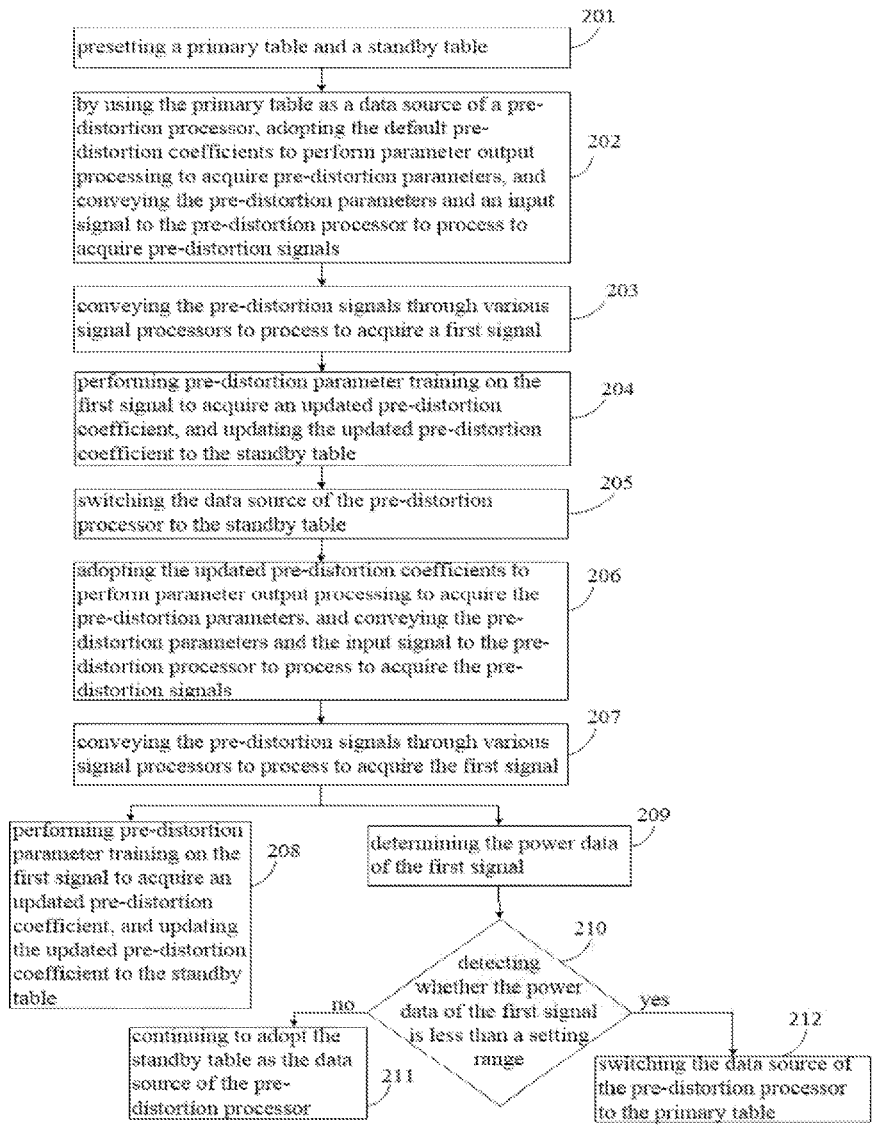
FIG. 2 is a flow chart showing a method for updating pre-distortion coefficients according to a second embodiment of the present application.

With reference to FIG. 2, it shows a flow chart of a method for updating pre-distortion coefficients according to a second embodiment of the present application.

Step 201, the user presets a primary table and an empty standby table.

The primary table stores default pre-distortion coefficients, while the standby table may be empty. Subsequently the pre-distortion coefficients acquired by pre-distortion coefficient training after pre-distortion processing may be updated to the standby table, such that the pre-distortion coefficients in the standby table may be updated in real time.

Step 202, by using the primary table as a data source of a pre-distortion processor, a parameter controller adopts the default pre-distortion coefficients to perform parameter output processing to acquire pre-distortion parameters, and conveys the pre-distortion parameters and an input signal to the pre-distortion processor to be processed to acquire pre-distortion signals.

The standby table is empty. Therefore, it is possible to firstly adopt the primary table as the data source of the pre-distortion processor, that is, to adopt the default pre-distortion coefficient sand the input signal to perform parameter output processing, so as to acquire a pre-distortion parameter this time. Then the method may convey the pre-distortion parameter and the input signal to the pre-distortion processor to process to acquire the pre-distortion signals.

Step 203, a plurality of signal processor process the pre-distortion signals to acquire a first signal.

Step 204, a parameter trainer performs pre-distortion parameter training on the first signal to acquire an updated pre-distortion coefficient, and updates the updated pre-distortion coefficient to the standby table.

Thus the first signal may be performed the pre-distortion coefficient training, so as to acquire a pre-distortion coefficient as the updated pre-distortion coefficient to be updated to the standby table. Wherein, the method of pre-distortion coefficient training is an existing technology, the description of which is omitted.

Optionally, the step of updating the updated pre-distortion coefficient to the standby table may comprise: calculating a coefficient weighted sum of the updated pre-distortion coefficient, and when the coefficient weighted sum satisfies a predefined condition, updating the updated pre-distortion coefficient to the standby table.

In the embodiment of the present application, it is possible to calculate the coefficient weighted sum of the updated pre-distortion coefficient, and determine the superiority and inferiority of the updated pre-distortion coefficient according to the coefficient weighted sum. In particular, it is possible to configure a predefined condition of the coefficient weighted sum to measure the superiority and inferiority of the updated pre-distortion coefficient. For example, the predefined condition is that the coefficient weighted sum is less than 1.3, and assuming the updated pre-distortion coefficient is $w_{m,q}$, m=1 . . . M, q=1 . . . Q, then the coefficient weighted sum could be $$\sum_{q=1}^{Q} w_{m,q}.$$

Then the method may detect whether the coefficient weighted sum satisfies the predefined condition; if the coefficient weighted sum is more than 1.3, the coefficient weighted sum will not satisfy the predefined condition, the updated pre-distortion coefficient will be ignored and the standby table will not updated. If the coefficient weighted sum is less than 1.3, the coefficient weighted sum will satisfy the predefined condition, and the updated pre-distortion coefficient will be updated to the standby table.

Step 205, a switch controller switches the data source of the pre-distortion processor to the standby table.

After the updated pre-distortion coefficient is updated to the standby table, the standby table stores the pre-distortion coefficient. Subsequently, the standby table may be used as the data source, and the updated pre-distortion coefficient in the standby table may be adopted to perform the pre-distortion processing.

Step 206, the parameter controller adopts the updated pre-distortion coefficients to perform parameter output processing to acquire the pre-distortion parameters, and conveys the pre-distortion parameters and the input signal to the pre-distortion processor to be processed to acquire the pre-distortion signals.

Step 207, the plurality of signal processors process the pre-distortion signals to acquire the first signal.

Step 208, the parameter trainer performs pre-distortion parameter training on the first signal to acquire an updated pre-distortion coefficient, and updates the updated pre-distortion coefficient to the standby table;

Here is substantially the same with Step 204, the description of which is omitted.

Step 209, an arithmetic unit determines the power data of the first signal.

Optionally, the step of determining the power data of the first signal may comprise: determining a power parameter according to the continuity of the first signal; performing the Fast Fourier Transformation (FFT) on the first signal, and determining the power data of the first signal together with the power parameter, wherein the power data includes at least one of an adjacent channel power and an adjacent channel power ratio.

The embodiment of the present application may detect the continuity of the first signal (for example, it is continuous or discontinuous) to determine the corresponding power parameter. Then an initial frequency point, a terminal frequency point and a center of frequency of corresponding first signal frequency band may be calculated by the power parameter, and the first signal may be performed the FFT, in order to determine the power parameter of the first signal, including the ACP and the ACPR and etc.

Step 210, the arithmetic unit detects whether the power data of the first signal is less than a setting range.

If no, that is, the power data of the first signal is more than or equal to the setting range, then proceed to Step 211; if yes, that is, the power data of the first signal is less than the setting range, then proceed to Step 212.

Step 211, the pre-distortion processor continues to adopt the standby table as the data source of the pre-distortion processor.

If the power data of the first signal is within the setting range, the method may continue to adopt the standby table as the data source of the pre-distortion processor.

Step 212, the switch controller switches the data source of the pre-distortion processor to the primary table.

If the power data of the first signal is not within the setting range, then the method may switch the data source of the pre-distortion processor to the primary table.

In conclusion, the first signal after processing the updated pre-distortion coefficient may be acquired in the embodiment of the present application, then the ACP and the ACPR of the first signal may be determined by the power parameter, in turn the status of interference of the updated pre-distortion coefficient with the neighbor cells and the condition of influence on signals within adjacent frequency band may be judged by the ACP and the ACPR, and then whether the data source during the pre-distortion processing is the primary table or the standby table may be determined. In such a manner, it is possible to adopt the superior pre-distortion coefficient to perform the pre-distortion processing, in order to reduce the interference with neighbor cells to the lowest extent.

Third Embodiment

Figure 3:
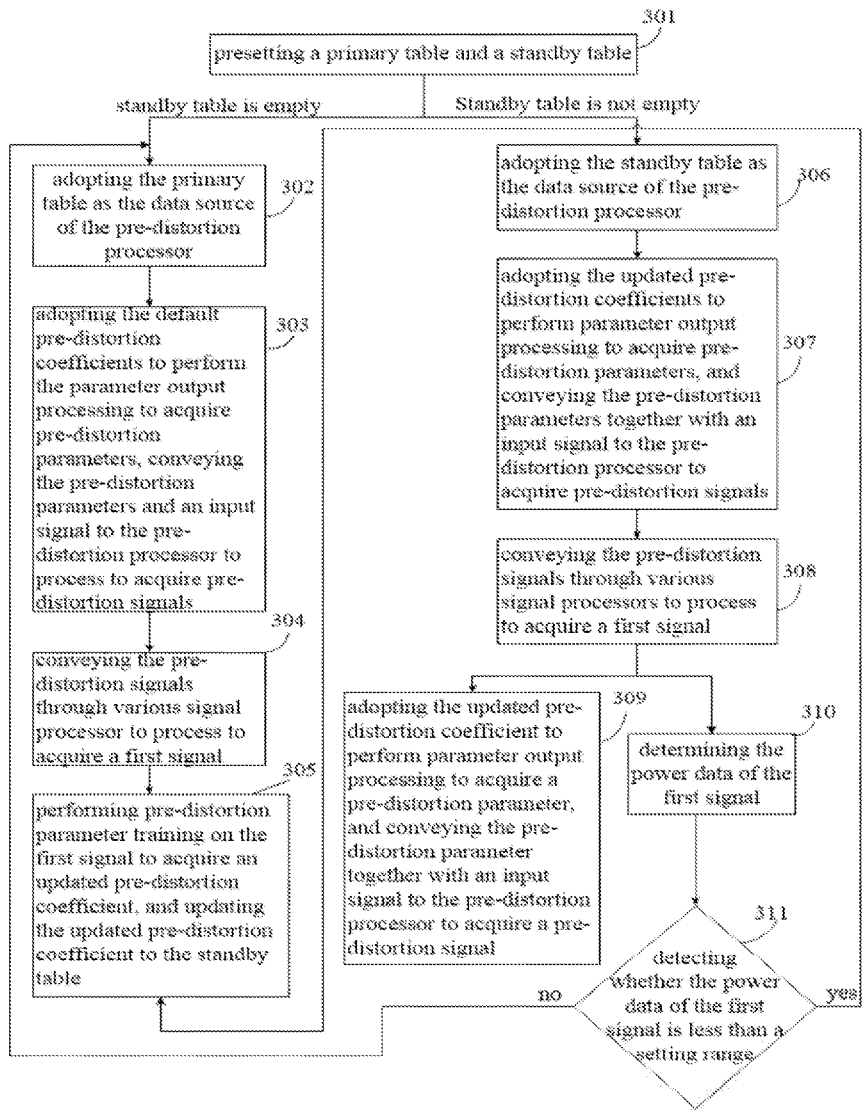
FIG. 3 is a flow chart showing a method for updating pre-distortion coefficients according to a third embodiment of the present application.

With reference to FIG. 3, it shows a flow chart of a method for switching pre-distortion coefficients according to a third embodiment of the present application.

Figure 4:
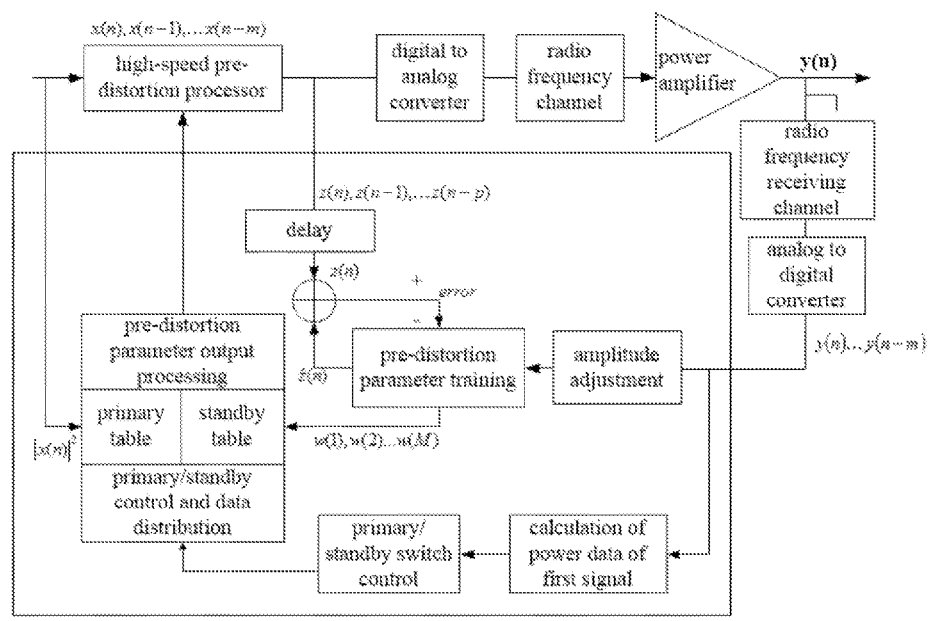
FIG. 4 is a schematic diagram of a switch processing of the pre-distortion coefficients according to the third embodiment of the present application.

With reference to FIG. 4, it shows a schematic diagram of a switch processing of pre-distortion coefficients according to the third embodiment of the present application.

Step 301, the user presets a primary table and a standby table.

In this embodiment, a storage device such as a Random Access Memory (RAM) may be adopted to constitute the primary table and the standby table, which is shown in FIG. 4. The switch between the primary table and the standby table and the distribution of data can be controlled by switching a controller.

In this embodiment, while the primary table is used as the pre-distortion parameter table in use, the standby table is used as the pre-distortion parameter table in update. For the LUT design in digital pre-distortion, M levels of memory are provided, and each level of memory factor corresponds to a set of primary-standby switch device. Thus there are 2*M sets of LUT coefficient tables in the system in total (see FIG. 5). Primary-standby switch may not cause exchange of contents in the LUT, but inform the pre-distortion channel that the standby table is in use. The information in the primary table is kept unchanged, which is neither updated nor reset. The system could switch back to the primary table at any time.

Figure 5:
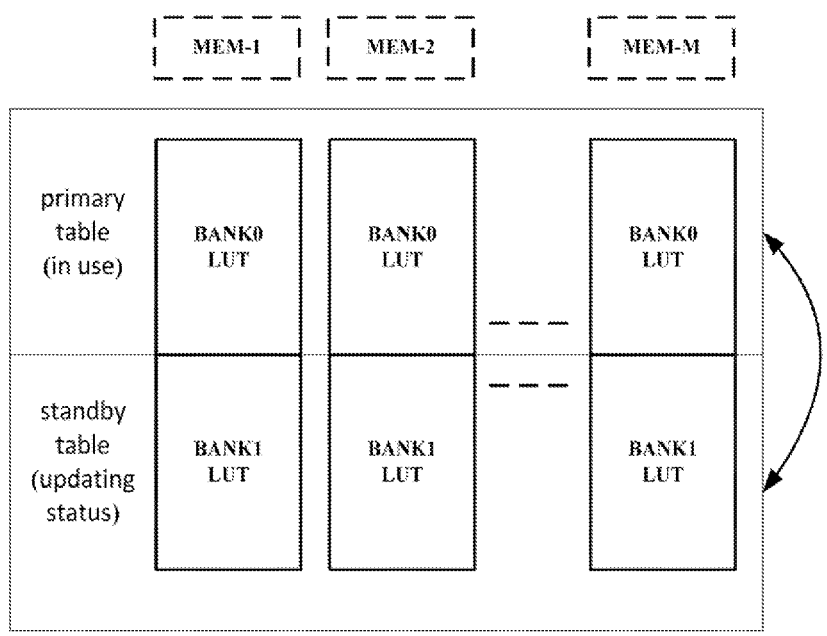
FIG. 5 is a schematic diagram of configuration of a primary table and a standby table in the switch processing of the pre-distortion coefficients according to the third embodiment of the present application.

FIG. 5 shows that the primary table is in use, while the standby table is in an updating state, that is, the pre-distortion coefficient therein is updated in real time.

If the standby table is empty, then the method may proceed to Step 302; if the standby table is not empty, then the method may proceed to Step 306.

Step 302, a pre-distortion processor adopts the primary table as the data source.

Step 303, a parameter controller adopts the default pre-distortion coefficients to perform the parameter output processing to acquire pre-distortion parameters, and conveys the pre-distortion parameters and an input signal to the pre-distortion processor to process to acquire pre-distortion signals.

As shown in FIG. 4, the arrow located between the block "pre-distortion parameters output processing" and the block "high-speed pre-distortion processor" is used to indicate a pre-distortion parameter is input to the high-speed pre-distortion processor, the arrow at the left side of the block "high-speed pre-distortion processor" is used to indicate an input signal is input to the high-speed pre-distortion processor.

In this embodiment, assuming that the input signal is $x(n), x(n-1), \ldots, x(n-m)$, at this point, the method may adopt the pre-distortion coefficient in the primary table together with the input signal to perform the parameter output processing to acquire the pre-distortion parameter. In particular, with reference to formula (2), the pre-distortion parameter is dependent on amplitude of the first signal and the pre-distortion coefficient. Then the method may convey the pre-distortion parameter and the input signal to the pre-distortion processor to acquire pre-distortion signals $z(n), z(n-1), \ldots, z(n-p)$.

Step 304, a plurality of signal processors process the pre-distortion signals to acquire a first signal.

In this embodiment, various signal processors may include DAC, Radio Frequency (RF) channel, Power Amplifier (PA), PF receiving channel, ADC, and etc.

In particular, it is possible to convey the pre-distortion signals sequentially through DAC, RF channel, and PA to acquire an output signal to be the output signal acquired by this pre-distortion processing. Then, the method may convey the output signal through PF receiving channel and ADC to process to acquire the first signal $y(n) \ldots y(n-m)$.

Step 305, a parameter trainer performs pre-distortion parameter training on the first signal to acquire an updated pre-distortion coefficient, and updates the updated pre-distortion coefficient to the standby table.

With reference to the path including block "amplitude adjustment" and "pre-distortion parameter training", after adjusting the amplitude of the first signal, the method may perform pre-distortion parameter training, so as to acquire an updated pre-distortion coefficient $w(1), w(2) \ldots w(M)$. In particular, as the path including the block "delay" in FIG. 4, it is possible to delay the pre-distortion signals $z(n), z(n-1), \ldots z(n-p)$, and then perform pre-distortion parameter training together with the first signal with adjusted amplitude to acquire an updated pre-distortion coefficient. Then it is possible to calculate a coefficient weighted sum of the updated pre-distortion coefficient, and to update the updated pre-distortion coefficient $w(1), w(2) \ldots w(M)$ to the standby table when the coefficient weighted sum satisfies a predefined condition. Herein, the pre-distortion parameter training is an existing technology, the description of which will be omitted in the embodiment of the present application.

Step 306, the pre-distortion processor adopts the standby table as the data source of the pre-distortion processor.

After adopting the default pre-distortion coefficients in the standby table to perform pre-distortion processing, subsequently the method may adopt the standby table as the data source of the pre-distortion processor.

In this embodiment, initially the input signal may use the pre-distortion coefficients in the primary table, and real-time updated pre-distortion coefficient may be stored in the standby table. When the primary table is used by a pre-distortion device, the pre-distortion coefficients in the standby table may be updated in real time. After the standby table is updated, the method may switch to use the updated standby table, and at this time the standby table is used as the data source.

Step 307, the parameter controller adopts the updated pre-distortion coefficients to perform parameter output processing to acquire pre-distortion parameters, and conveys the pre-distortion parameters together with an input signal to the pre-distortion processor to acquire pre-distortion signals.

Here is substantially the same with Step 303, the description of which is omitted.

Step 308, the plurality of signal processors process the pre-distortion signals to acquire a first signal.

Step 309, the parameter trainer performs pre-distortion parameter training on the first signal to acquire an updated pre-distortion coefficient, and updates the updated pre-distortion coefficient to the standby table.

Optionally, the step of updating the updated pre-distortion coefficient to the standby table may comprise: calculating a coefficient weighted sum of the updated pre-distortion coefficient, and updating the updated pre-distortion coefficient to the standby table when the coefficient weighted sum satisfies a predefined condition.

Step 310, the arithmetic unit determines the power data of the first signal.

With reference to the path including the block "calculation of power data of first signal" in FIG. 4, optionally, the step of determining the power data of the first signal may comprise: determining a power parameter according to the continuity of the first signal; performing the Fast Fourier Transformation on the first signal, and determining the power data of the first signal together with the power parameter, wherein the power data includes at least one of an adjacent channel power and an adjacent channel power ratio.

Optionally, the step of determining the power parameter according to the continuity of the first signal may comprise: detecting the continuity of the first signal, and searching a corresponding parameter configuration table for the power parameter according to the continuity, wherein the power parameter includes at least one of sampling rate, central frequency point, number of sampling points, number of carriers, carrier in-band width and carrier transmission band width.

If the first signal is a continuous signal with consistent band width, then the first parameter configuration table is as shown in Table 1:

TABLE 1

| Parameters | Values | Signification |
|---|---|---|
| Sampling rate (fs) | (122.88 . . .) MHz | Sampling rate of ADC |
| Central frequency point (centr_freq) | (0 . . .) MHz | Central frequency point |
| Number of sampling points (fft_size) | (4096, . . .) | Number of sampling points of ADC, number of points of FFT |
| Number of carriers (maxcarrier) | (1, 3 . . .) | Number of carriers |

TABLE 1-continued

| Parameters | Values | Signification |
|---|---|---|
| Carrier in-band width (carrier_band) | (20, 1.6) MHz | Carrier in-band width |
| Carrier transmission band width (Sweep_band) | (18, 1.28) MHz | Carrier transmission band width |

Herein, the carrier is the first signal.

Optionally, the step of performing the Fast Fourier Transformation on the first signal, and determining the power data of the first signal together with the power parameter may comprise: calculating various frequency points of frequency band of the first signal according to the power parameter; performing the Fast Fourier Transformation to acquire a power spectral density of each frequency point after denoising and correcting the first signal; performing weighting process on the power spectral density, and determining an effective power and an adjacent channel power of the first signal; calculating a ratio of the effective signal power to the adjacent channel signal power and taking the logarithm, to acquire an adjacent channel power ratio of the first signal. It may particularly comprise the following steps.

Firstly, the method may calculate the number of sampling points corresponding to each MHZ according to sampling rate and FFT_SIZE:

$$\text{fft\_point} = \frac{\text{fft\_size}}{fs} \quad (3)$$

band_point=fft_point*carrier_band centre_point=fft_point*centre_freq      (4)

sweep_point=fft_point*sweep_band dif_point=sweep_point−band_point wherein, fft_point is the number of sampling points of FFT, band_point is the number of sampling points of band width, centre_point is number of sampling points of the central frequency point, sweep_point is the number of sampling points of sweep, dif_point is the number of sampling points of interval.

centre_point=mod(fft_size+centre_freq,fft_size)      (5)

left_point=mod(fft_size+centre_point−
maxcarrier*sweep_point/2+dif_point/2,fft_size)      (6)

right_point=mod(fft_size+centre_point+
maxcarrier*sweep_point/2+dif_point/2,fft_size)      (7)

The denoising and correcting process may be performed on the signal [y(n)] before calculating power, in order to make the calculated ACPR more exact.

$y(n)$=weight1$(n)$*[$y(n)$−a*weight2$(n)$*$y(n)$]      (8)

Herein, 0≤a≤1.

According to formula (8), $$y(n) = \text{weight1}(n)^* y(n) - \alpha^* \text{weight1}(n)^* \text{weight2}(n)^* y(n)$$

$$= (\text{weight1}(n) - \alpha^* \text{weight1}(n)^* \text{weight2}(n))^* y(n)$$

$$= \text{win}(n)^* y(n)$$

Accordingly, the signal y(n) can be updated by adding window as following:

$y(n)$=$y(n)$*win;

wherein, the window function win can be as following:
win=hanning(L); or,
win=kaiser(L,6); or,
win=hamming(L); or,
win=chebwin(L).

Herein, the description of the MATLAB functions of hanning( ), kaiser( ), hamming( ) and chebwin( ) are as follows.

hanning(N) returns the N-point symmetric Hanning window in a column vector. (Note that the first and last zero-weighted window samples are not included.)

W=kaiser(N,BTA) returns the BETA-valued N-point Kaiser window. (If omitted, BTA is set to 0.500.)

hamming( ), i.e., Hamming window, hamming(N) returns the N-point symmetric Hamming window in a column vector.

chebwin( ), i.e., Chebyshev window, chebwin(N) returns an N-point Chebyshev window in a column vector.

The weight 1 and the weight 2 may be acquired by continually being corrected according to the band width and the length of signal.

The corrected signal may be performed the FFT transformation, then taking absolute value and squaring, so as to acquire the power spectral density of each frequency point.

carr_freq$(n)$=|FFT[$y(n)$]|^2 $n$=1, . . . ,fft_size      (9)

Total power of entire frequency band:

$$\text{all\_power} = \sum_{n=1}^{fft\_size} |FFT[y(n)]|^2 \quad n = 1 \ldots \text{fft\_size} \quad (10)$$

The in-band power of the first signal (namely, integral of the in-band power points of the first signal) may be determined according to the power spectral density of each frequency point. In this regard, there are two situations. If the low frequency band is at minus frequency point, then the effective power (effective signal power) is calculated by:

$$\text{signal\_pow} = \sum_{n=left\_point}^{right\_point} \text{carr\_freq}(n) \quad (11)$$

Left adjacent channel power (left adjacent channel signal power):

$$\text{ac\_left\_pow} = \sum_{n=ac\_left\_left}^{ac\_left\_right} \text{carr\_freq}(n) \quad (12)$$

Right adjacent channel power (right adjacent channel signal power):

$$\text{ac\_right\_pow} = \sum_{n=ac\_right\_left}^{ac\_right\_right} \text{carr\_freq}(n) \quad (13)$$

The method may calculate a ratio of the effective signal power to the adjacent channel signal power, and the take the logarithm to acquire ACPR:

$$ACPR_{left} = 10 \cdot \log_{10}\left(\frac{\text{signal\_pow}}{\text{ac\_left\_pow}}\right) \quad (14)$$

$$ACPR_{right} = 10 \cdot \log_{10}\left(\frac{\text{signal\_pow}}{\text{ac\_right\_pow}}\right) \quad (15)$$

Herein, the weighting process is performed in formulas (11), (12) and (13), such that the ACPR with weighting process may be derived from formulas (14) and (15); if the weighting process is not performed in formulas (11), (12) and (13), then the ACPR without weighting process may be derived accordingly.

Figure 6:
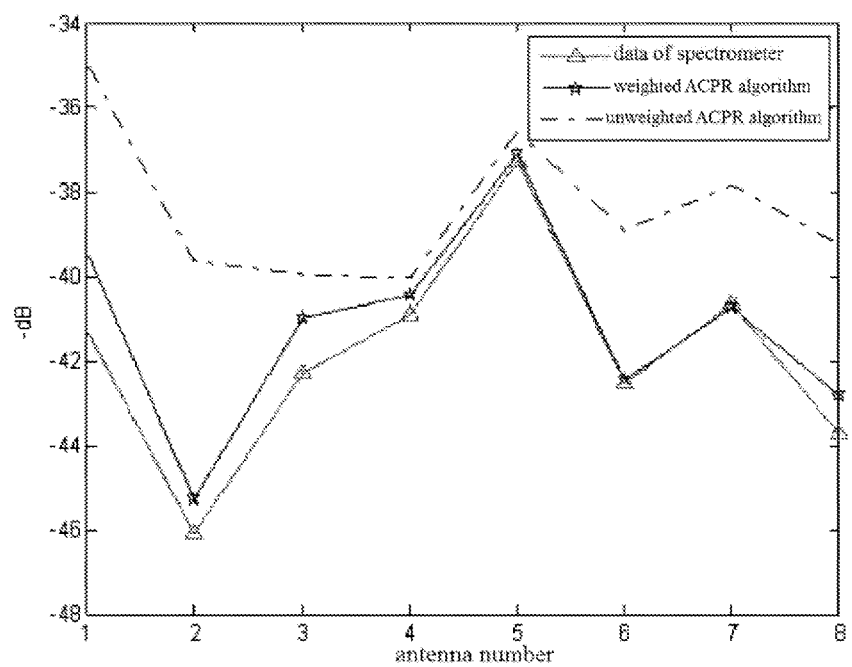
FIG. 6 is an ACPR graphical chart of a left adjacent channel in the switch processing of the pre-distortion coefficients according to the third embodiment of the present application.
Figure 7:
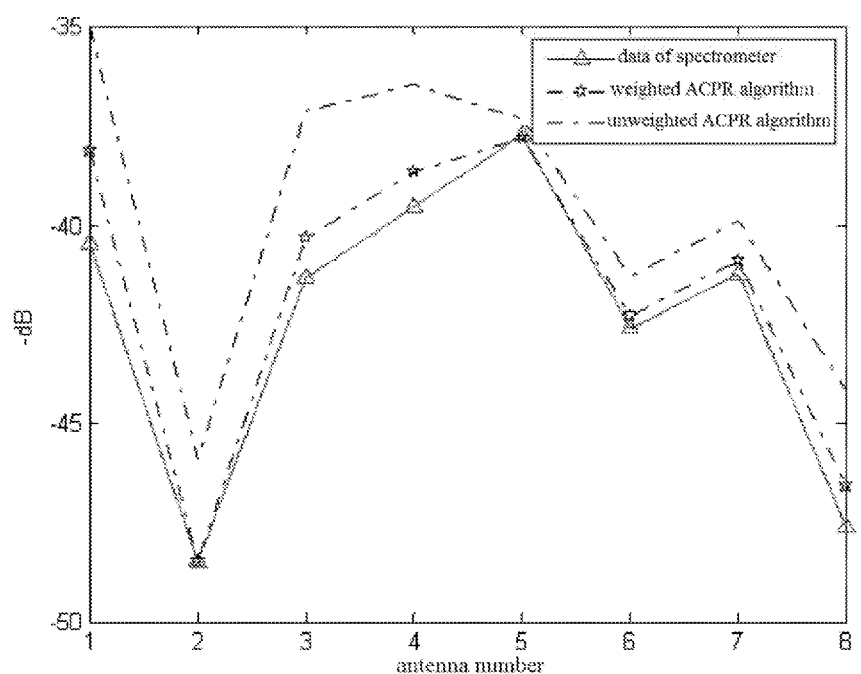
FIG. 7 is an ACPR graphical chart of a right adjacent channel in the switch processing of the pre-distortion coefficients according to the third embodiment of the present application.

In a specific example, the accuracy of the ACPR with weighting algorithm may be significantly improved, and the ACPR status of signal can be reflected more truly, as shown in FIGS. 6 and 7. Herein, FIG. 6 is the ACPR of the left adjacent channel, and FIG. 7 is the ACPR of the right adjacent channel.

Herein, the ACPR value obtained by using the ACPR algorithm with weighting and denoising to calculate a feedback signal may be very close to a test result of a frequency spectrum instrument. Therefore, the ACPR algorithm with weighting and denoising is able to exactly calculate the real status of signal.

Step 311, the arithmetic unit detects whether the power data of the first signal is less than a setting range.

If not, that is, the power data of the first signal is more than or equal to the setting range, the process may return to Step 306, and continue to adopt the standby table as the data source of the pre-distortion processor; if yes, that is, the power data of the first signal is less than the setting range, the process may return to Step 302, and switch the data source of the pre-distortion processor to the primary table.

The input signal initially uses the pre-distortion coefficients in the primary table, and stores the pre-distortion coefficients in the standby table. When the primary LUT is used by a high-speed pre-distortion device, the pre-distortion coefficients in the standby table are updated in real time. When the standby table is completely updated, the pre-distortion processor is notified to use the updated standby table, while the standby table becomes the data source. At this point, the updated standby table is only temporarily used, and whether to continue to use it will depend on the effect of signal processing by the updated pre-distortion coefficients in the standby table. That is, the feedback first signal is continually collected and performed the FFT to perform ACP statistics. If the ACP and the ACPR are superior, then the process may continue to use newly updated standby table; if the ACP and the ACPR are inferior, then the process may switch to the original primary table.

In the embodiment of the present application, since the primary table and the standby table are configured to be switchable to each other, a set of training sequence may be stored to constitute the primary table at the start of building stations. In subsequent update process of LUT, the DPD system may have a readily available set of primary table.

In this embodiment, in order to observe a variation trend of the ACPR, a plurality of sets of ACPR values ACPR(1), . . . ACPR(L) may be stored. If the ACPR is continually deteriorated, then it will be necessary to switch back to the primary table.

If the ACPR is continually deteriorated, then pre-distortion coefficients corresponding to the most superior set of ACPR may be selected to update the standby table.

As long as the pre-distortion coefficients are stored, the updated standby table may be acquired by the following algorithm:

$$LUT_m(r) = A \cdot \sum_{q=1}^{Q} w_{m,q} \cdot (r \cdot Q)^{(q-1)} \quad r = 1, \ldots R \quad m = 1, \ldots M$$

wherein, M is a length of memory factor, for example, assigning 4, 5 or 6, etc.; Q is a non-linear factor, for example, assigning 4, 5 or 6, etc.; R is a length of LUT table stored in one level of memory factor, for example, generally assigning 256 or 512 and etc.; and Q is a quantization factor, equal to a maximum signal capable of being stored in the system/R, for example, Q=32768/R, if R=512, then Q=64.

Therefore, as long as the pre-distortion coefficients are stored, the update of the standby table may be completed rapidly.

In conclusion, in this embodiment, it is possible to perform denoising and FFT processing on the first signal, and determine the ACP and the ACPR of the first signal according to the power parameter, such that the determined ACP and the determined ACPR have relatively high accuracy, so as to relatively exactly determine the interference status of the pre-distortion coefficient with neighbor cells, in turn to relatively exactly select the data source.

Fourth Embodiment

Figure 8:
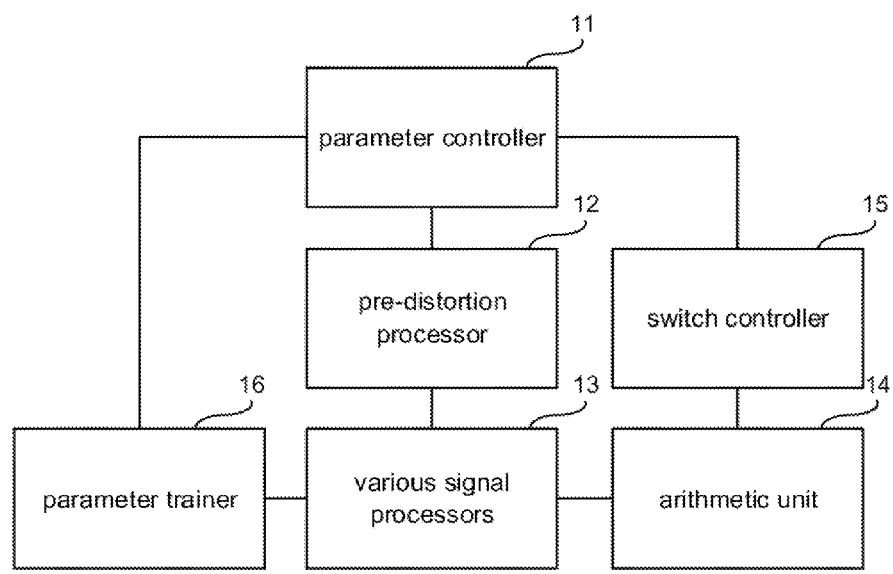
FIG. 8 is a block diagram of a system for updating pre-distortion coefficients according to a fourth embodiment of the present application.

With reference to FIG. 8, it shows a block diagram of a system for updating pre-distortion coefficients according to a fourth embodiment of the present application.

Accordingly, the embodiment of the present application also provides a system for updating pre-distortion coefficients, including: a parameter controller 11, a pre-distortion processor 12, various signal processors 13, an arithmetic unit 14 and a switch controller 15, wherein:

the parameter controller 11 comprises: a primary table and a standby table, wherein the primary table stores default pre-distortion coefficients and the standby table stores updated pre-distortion coefficients;

the parameter controller 11 is configured to adopt the updated pre-distortion coefficients to perform parameter output processing to acquire pre-distortion parameters, when a data source of the pre-distortion processor adopts the standby table;

the pre-distortion processor 12 is configured to convey the pre-distortion parameters and an input signal to the pre-distortion processor to acquire pre-distortion signals;

the various signal processors 13 are configured to process the pre-distortion signals to acquire a first signal;

the arithmetic unit 14 is configured to determine the power data of the first signal; and the switch controller 15 is configured to, if the power data of the first signal is more than or equal to a setting range, continue to adopt the standby table as the data source of the pre-distortion processor; if the power data of the first signal is less than the setting range, switch the data source of the pre-distortion processor to the primary table.

Optionally, the arithmetic unit 14 is particularly configured to determine a power parameter according to the continuity of the first signal; perform the Fast Fourier Transformation on the first signal, and determine the power data of the first signal together with the power parameter, wherein the power data includes at least one of an adjacent channel power and an adjacent channel power ratio.

Optionally, the arithmetic unit 14 is particularly configured to detect the continuity of the first signal, and search a corresponding parameter configuration table for the power parameter according to the continuity, wherein the power parameter includes at least one of sampling rate, central frequency point, number of sampling points, number of carriers, carrier in-band width and carrier transmission band width.

Optionally, the arithmetic unit 14 is particularly configured to calculate various frequency points of frequency band of the first signal according to the power parameter; perform the Fast Fourier Transformation to acquire a power spectral density of each frequency point after denoising and correcting the first signal; perform weighting process on the power spectral density, and determine an effective power and an adjacent channel power of the first signal; calculate a ratio of the effective signal power to the adjacent channel signal power and take the logarithm, to acquire an adjacent channel power ratio of the first signal.

Optionally, if the standby table is empty at the time of presetting; the parameter controller 11 may be further configured to adopt the default pre-distortion coefficients to perform parameter output processing to acquire pre-distortion parameters by using the primary table as the data source of the pre-distortion processor;

the pre-distortion processor 12 may be configured to convey the pre-distortion parameters and input signal to the pre-distortion processor to process to acquire pre-distortion signals; and the various signal processors 13 may be configured to convey the pre-distortion signals through various signal processors to process to acquire a first signal.

Optionally, a parameter trainer 16 is configured to perform pre-distortion parameter training on the first signal to acquire an updated pre-distortion coefficient, and update the updated pre-distortion coefficient to the standby table.

Optionally, the switch controller 15 is further configured to, if the primary table is used as the data source of the pre-distortion processor, then after updating the updated pre-distortion coefficient to the standby table, switch the data source of the pre-distortion processor to the standby table.

Optionally, the parameter trainer 16 is particularly configured to calculate a coefficient weighted sum of the updated pre-distortion coefficient, and when the coefficient weighted sum satisfies a predefined condition, update the updated pre-distortion coefficient to the standby table.

In conclusion, a primary table and a standby table may be preset in the embodiment of the present application, wherein the primary table stores default pre-distortion coefficients, and the standby table stores updated pre-distortion coefficients. In such a manner, when the standby table is used as a data source, the updated pre-distortion coefficient may be performed pre-distortion processing to acquire feedback power data of the first signal. The power data of the first signal may be detected in the embodiment of the present application, if the power data is within a setting range, then the standby table is continued to adopt as the data source of the pre-distortion processor; if the power data is not within the setting range, then the data source of the pre-distortion processor is switched to the primary table. In such a manner, it may be possible to detect the status of the power data, in turn judge whether it interferes with neighbor cells and the status of in-band signals is deteriorated, subsequently judge the status of the real-time updated pre-distortion coefficients, and then select the primary table or the standby table according to a specific condition, in order to reduce the interference with neighbor cells to the lowest extent.

Secondly, the first signal after processing the updated pre-distortion coefficient may be acquired in the embodiment of the present application, then the ACP and the ACPR of the first signal may be determined by the power parameter, in turn the status of interference of the updated pre-distortion coefficient with the neighbor cells and the condition of influence on signals within adjacent frequency band may be judged by the ACP and the ACPR, and then whether the data source during the pre-distortion processing is the primary table or the standby table may be determined. In such a manner, it is possible to adopt the superior pre-distortion coefficient to perform the pre-distortion processing, in order to reduce the interference with neighbor cells to the lowest extent.

In this embodiment, it is possible to perform denoising and FFT processing on the first signal, and determine the ACP and the ACPR of the first signal according to the power parameter, such that the determined ACP and the determined ACPR have relatively high accuracy, so as to relatively exactly determine the interference status of the pre-distortion coefficient with neighbor cells, in turn to relatively exactly select the data source.

Since the system embodiment is substantially similar to the method embodiments, the description thereof is relatively brief. As for the related parts thereof, reference may be made to the corresponding description of the method embodiments.

The various embodiments in the specification have been explained step by step. Each of the embodiments has only emphasized the differences from others, and the same or similar parts between embodiments could be made reference to each other.

The present application can be described in general context of a computer executable instruction which is executed by the computer, such as a program module. Generally, the program module may include routine, program, object, component, data structure and the like which can perform particular tasks or implement particular abstract data types. The present application can also be practiced in distributed computing environments. In such a distributed computing environment, the program module can be connected to a remote processing device through a communication network to perform the task. In the distributed computing environment, the program module may be located in local and remote computer storage medium including a storage device.

In the end, it will be explained that, the terms "first", "second", etc. are only used herein to distinguish one element or operation from another one, and does not necessarily require or suggest that there are any actual relationship or sequence between these elements or operations. Further, the terms "comprise", "include" and any other variants thereof are intended to cover a non-exclusive "comprise", so that process, method, product or equipment which includes a series of elements may include not only those elements, but also other elements that do not be definitely listed, or also may include the inherent elements of the process, method, product or equipment. In the absence of more restrictions, an element defined by the statement "includes a . . . " does not mean to exclude other same elements in the process, method, product or equipment including this element.

Described above are the method and the system for updating pre-distortion coefficients according to the present application. Herein the principles and embodiments of the present application are illustrated by way of specific examples. The embodiments described above are only intended to help understand the method and main concept of the present application. Meanwhile, for an ordinary person skilled in the art, variations could be made to the specific embodiments and their application scope in accordance with the concept of the present application. In summary, the disclosure of the specification should not be construed as limiting of the present application.

The invention claimed is:

1. A method for updating pre-distortion coefficients, comprising:
   presetting a primary table and a standby table, wherein the primary table stores default pre-distortion coefficients and the standby table stores updated pre-distortion coefficients;
   when a data source of a pre-distortion processor adopts the standby table, adopting the updated pre-distortion coefficients to perform parameter output processing to acquire pre-distortion parameters, and conveying the pre-distortion parameters and an input signal to the pre-distortion processor to process to acquire pre-distortion signals;
   conveying the pre-distortion signals through various signal processors to process to acquire a first signal, and determining the power data of the first signal;
   if the power data of the first signal is more than or equal to a setting range, continuing to adopt the standby table as the data source of the pre-distortion processor; and
   if the power data of the first signal is less than the setting range, switching the data source of the pre-distortion processor to the primary table.

2. The method according to claim 1, wherein, the step of determining the power data of the first signal comprises:
   determining power parameters according to the continuity of the first signal; and
   performing the Fast Fourier Transformation on the first signal, and determining the power data of the first signal together with the power parameters, wherein the power data includes at least one of an adjacent channel power and an adjacent channel power ratio.

3. The method according to claim 2, wherein, the step of determining the power parameters according to the continuity of the first signal comprises:
   detecting the continuity of the first signal, and searching a corresponding parameter configuration table for the power parameters according to the continuity, wherein the power parameters include at least one of sampling rate, central frequency point, number of sampling points, number of carriers, carrier in-band width and carrier transmission band width.

4. The method according to claim 3, wherein, the step of performing the Fast Fourier Transformation on the first signal, and determining the power data of the first signal together with the power parameters comprises:
   calculating various frequency points of frequency band of the first signal according to the power parameters;
   performing the Fast Fourier Transformation to acquire a power spectral density of each frequency point after denoising and correcting the first signal;
   performing weighting process on the power spectral density, and determining an effective power and an adjacent channel power of the first signal; and
   calculating a ratio of the effective signal power to the adjacent channel signal power and taking the logarithm, to acquire an adjacent channel power ratio of the first signal.

5. The method according to claim 1, wherein, the method further comprises:
   if the standby table is empty at the time of presetting, using the primary table as the data source of the pre-distortion processor, adopting the default pre-distortion coefficients to perform parameter output processing to acquire pre-distortion parameters, and conveying the pre-distortion parameters based on the default pre-distortion coefficients and the input signal to the pre-distortion processor to process to acquire pre-distortion signals.

6. The method according to claim 5, wherein, after the step of conveying the pre-distortion signals through various signal processors to process to acquire a first signal, the method further comprises:
   performing pre-distortion parameter training on the first signal to acquire an updated pre-distortion coefficient, and updating the updated pre-distortion coefficient to the standby table.

7. The method according to claim 6, wherein, the step of updating the updated pre-distortion coefficient to the standby table comprises:
   calculating a coefficient weighted sum of the updated pre-distortion coefficient, and when the coefficient weighted sum satisfies a predefined condition, updating the updated pre-distortion coefficient to the standby table.

8. The method according to claim 1, wherein, after the step of conveying the pre-distortion signals through various signal processors to process to acquire a first signal, the method further comprises:
   performing pre-distortion parameter training on the first signal to acquire an updated pre-distortion coefficient, and updating the updated pre-distortion coefficient to the standby table.

9. The method according to claim 8, wherein, the method further comprises:
   if the primary table is used as the data source of the pre-distortion processor, then after updating the updated pre-distortion coefficient to the standby table, switching the data source of the pre-distortion processor to the standby table.

10. The method according to claim 8, wherein, the step of updating the updated pre-distortion coefficient to the standby table comprises:
    calculating a coefficient weighted sum of the updated pre-distortion coefficient, and when the coefficient weighted sum satisfies a predefined condition, updating the updated pre-distortion coefficient to the standby table.

11. A system for updating pre-distortion coefficients, the system comprising: a parameter controller, a pre-distortion processor, various signal processors, an arithmetic unit and a switch controller;
    wherein,
    the parameter controller comprises: a primary table and a standby table, wherein the primary table stores default pre-distortion coefficients and the standby table stores updated pre-distortion coefficients;
    the parameter controller is configured to adopt the updated pre-distortion coefficients to perform parameter output processing to acquire pre-distortion parameters, when a data source of the pre-distortion processor adopts the standby table;

the pre-distortion processor is configured to convey the pre-distortion parameters and an input signal to the pre-distortion processor to acquire pre-distortion signals;

the various signal processors are configured to process the pre-distortion signals to acquire a first signal;

the arithmetic unit is configured to determine the power data of the first signal; and the switch controller is configured to, if the power data of the first signal is more than or equal to a setting range, continue to adopt the standby table as the data source of the pre-distortion processor; if the power data of the first signal is less than the setting range, switch the data source of the pre-distortion processor to the primary table.

12. The system according to claim 11, wherein, the arithmetic unit is particularly configured to determine power parameters according to the continuity of the first signal; perform the Fast Fourier Transformation on the first signal, and determine the power data of the first signal together with the power parameters, wherein the power data includes at least one of an adjacent channel power and an adjacent channel power ratio.

13. The system according to claim 12, wherein, the arithmetic unit is particularly configured to detect the continuity of the first signal, and search a corresponding parameter configuration table for the power parameters according to the continuity, wherein the power parameters include at least one of sampling rate, central frequency point, number of sampling points, number of carriers, carrier in-band width and carrier transmission band width.

14. The system according to claim 13, wherein, the arithmetic unit is particularly configured to calculate various frequency points of frequency band of the first signal according to the power parameter; perform the Fast Fourier Transformation to acquire a power spectral density of each frequency point after denoising and correcting the first signal; perform weighting process on the power spectral density, and determine an effective power and an adjacent channel power of the first signal; calculate a ratio of the effective signal power to the adjacent channel signal power and take the logarithm, to acquire an adjacent channel power ratio of the first signal.

15. The system according to claim 11, further comprising:

if the standby table is empty at the time of presetting, the parameter controller is further configured to, by using the primary table as the data source of the pre-distortion processor, adopt the default pre-distortion coefficients to perform parameter output processing to acquire pre-distortion parameters.

16. The system according to claim 15, wherein, the system further includes:

a parameter trainer which is configured to perform pre-distortion parameter training on the first signal to acquire an updated pre-distortion coefficient, and update the updated pre-distortion coefficient to the standby table.

17. The system according to claim 16, wherein, the parameter trainer is particularly configured to calculate a coefficient weighted sum of the updated pre-distortion coefficient, and when the coefficient weighted sum satisfies a predefined condition, update the updated pre-distortion coefficient to the standby table.

18. The system according to claim 11, wherein, the system further includes:

a parameter trainer which is configured to perform pre-distortion parameter training on the first signal to acquire an updated pre-distortion coefficient, and update the updated pre-distortion coefficient to the standby table.

19. The system according to claim 18, wherein, the switch controller is further configured to, if the primary table is used as the data source of the pre-distortion processor, then after updating the updated pre-distortion coefficient to the standby table, switch the data source of the pre-distortion processor to the standby table.

20. The system according to claim 18, wherein, the parameter trainer is particularly configured to calculate a coefficient weighted sum of the updated pre-distortion coefficient, and when the coefficient weighted sum satisfies a predefined condition, update the updated pre-distortion coefficient to the standby table.

* * * * *